July 28, 1959 W. W. SCHWEISS 2,897,353
NON-LINEAR DEVICE VARYING IMPEDANCE MATCH BETWEEN ANTENNA AND RADIO FREQUENCY STAGES
Filed Oct. 20, 1955
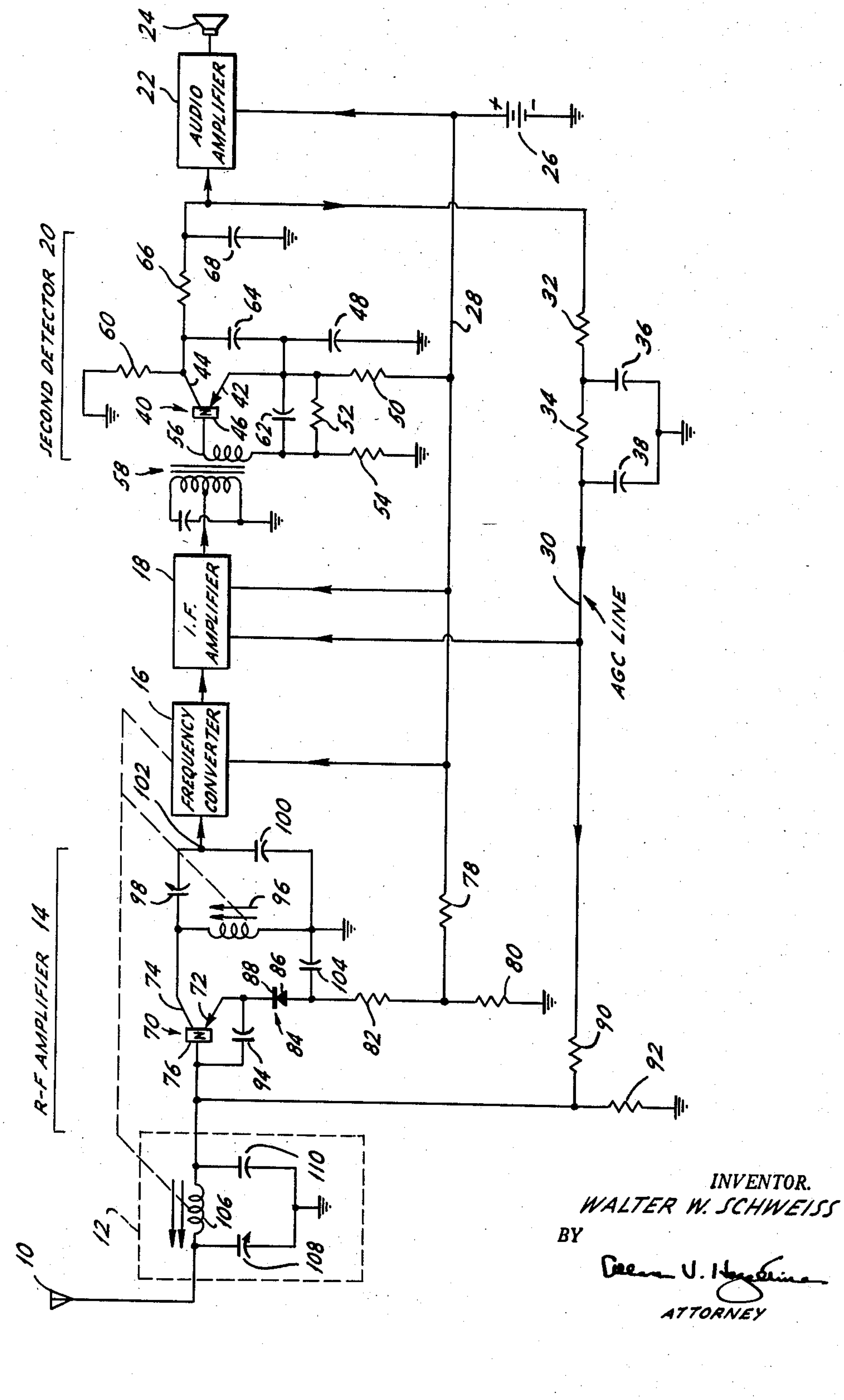
INVENTOR.
WALTER W. SCHWEISS
BY
[signature]
ATTORNEY 2,897,353

NON-LINEAR DEVICE VARYING IMPEDANCE MATCH BETWEEN ANTENNA AND RADIO FREQUENCY STAGES

Walter W. Schweiss, Ardsley, Pa., assignor to Philco Corporation, Philadelphia, Pa., a corporation of Pennsylvania Application October 20, 1955, Serial No. 541,659

13 Claims. (Cl. 250—20)

This invention relates to semiconductive apparatus, and more particularly to semiconductive amplifiers of controllable gain.

One factor which has heretofore impeded the development of commercial radio receiving equipment utilizing transistors has been the problem of varying the effective gain of a transistor amplifier stage over a sufficiently wide range of values. While such gain variations are relatively simple to achieve in vacuum-tube amplifiers by varying the control-bias of a variable-transconductance vacuum tube included therein, these gain variations are relatively difficult to achieve in transistor amplifiers, particularly since transistors having gain-variable characteristics comparable to those of variable-transconductance vacuum tubes are not generally available at this time. On the contrary, because the collector current-collector voltage characteristics of most transistors are substantially linear and are substantially equally spaced for equal increments of emitter current, it is very difficult to vary the gain of a transistor. Indeed, in order to achieve any substantial control over the gain of a transistor amplifier, it is necessary to supply the input signal for the transistor from a voltage source which has an impedance which is equal to or lower than the minimum input impedance of the transistor, thereby to take advantage of the appreciable change in the input impedance of the transistor produced in response to a variation of the biasing voltage. By changing the input impedance of the transistor with respect to the impedance of the source, it is possible to produce an impedance mismatch between the transistor and the source such that the transistor will absorb less power from the source as the impedance thereof is raised, thereby reducing the gain of the amplifier stage.

In the prior-art arrangements of this form, it was found that most effective control is obtained when the emitter-to-base voltage bias has a value such that the static collector current is substantially cut off. Such an operating condition is, however, highly disadvantageous because the system is particularly susceptible to overloading by strong input signals, to an extent such that the system departs markedly from Class A operation. Moreover, under these conditions, the transistor is operating in a substantially non-linear portion of its characteristics, with the result that the output signal of the amplifier may be badly distorted even for input signals which are insufficiently strong to overload the amplifier.

It is accordingly an object of the invention to provide improvements in gain-controllable semiconductive apparatus.

Another object of the invention is to provide semiconductive signal-translating apparatus in which the gain may be readily varied.

An additional object of the invention is to provide a semiconductive signal-translating device having an input impedance which is susceptible of wide variation in response to an appropriate variation in the value of a control potential.

A still further object of the invention is to provide semiconductive signal-translating apparatus in which Class A operation is obtained over a wide range of gain values.

An additional object of the invention is to provide semiconductive signal-translating apparatus which need not be operated under conditions of small collector currents.

Yet another object of the invention is to provide gain-controllable semiconductive signal-translating apparatus which is relatively simple in structure and inexpensive to construct.

A specific object of the invention is to provide a transistor amplifier which is particularly well suited for use in radio-frequency amplifying stages of a radio receiver because it is capable of having its gain controllably varied over a wide range of values without introducing undue signal distortion.

In accordance with the invention, the foregoing objects are achieved by the provision of a semiconductive signal-translating system which comprises a transistor having emitter, collector and base electrodes, a non-linear direct-current-conductive impedance element having an impedance value dependent on the value of a voltage applied thereacross and connected in series with the emitter electrode, and means for deriving an output signal from the collector electrode in response to an input signal supplied to the base electrode.

In a preferred form, the semiconductive signal-translating system of my invention additionally comprises a capacitor connected from the emitter to the base of the transistor, and may have, as its non-linear impedance element, a diode which is poled in a forward-conductive sense and which connects the emitter electrode to a source of forward-biasing potential. In addition, the system may comprise a source of alternating voltage which is connected between the base electrode of the transistor and a point at reference potential, and which has a series output impedance less than that minimum input impedance characterizing the transistor circuit at the frequency of the signal source, when the diode is at its minimum resistance. The system may additionally comprise a source of a direct voltage which is supplied to the base electrode of the transistor as a control potential and whose value is directly dependent upon the amplitude of the alternating voltage supplied by said source.

In a specific form of the invention, my novel signal-translating system may be utilized as the R.-F. amplifier of a signal receiver; the aforementioned source of an alternating voltage may comprise the antenna circuit of this receiver; and the aforementioned source of a direct control voltage may include the AGC rectifier of this receiver. This AGC rectifier may be arranged to supply a control potential such that an increase in its value, produced in response to an increase in the amplitude of the alternating voltage, produces a reduction in the base-to-emitter voltage of the transistor, and consequently a reduction in the emitter current thereof.

In response to the latter change, the impedance of the non-linear impedance element, connected in series with the emitter, increases, as does the emitter-to-base impedance. These impedance increases are reflected as an increase in input impedance, which is further augmented by the cooperative action of the non-linear element and the capacitor interconnecting the base and emitter electrodes. Specifically, this augmentation occurs because the capacitor exerts an input impedance-depressing effect which is progressively reduced as the value of the non-linear impedance rises. Because of the inclusion of the aforementioned capacitor, the input impedance of my novel amplifier is initially lower than that of prior-art arrangements, while, because of the novel cooperation of the components of my amplifier, the percentage change in input impedance, per unit change in AGC potential, is greater than in the prior-art arrangements. As a result, the change produced in the power gain of the amplifier, per unit change in the AGC potential, is considerably greater than for prior-art arrangements.

Other advantages and features of the invention will become apparent from a consideration of the following detailed description, taken in connection with the accompanying drawing, the single figure of which is a schematic diagram of a radio receiving apparatus embodying a signal-translating system according to my invention.

The signal receiving apparatus shown in the drawing is a superheterodyne receiver of conventional form, comprising an antenna 10, an impedance-transforming network 12, an R.-F. amplifier 14, a frequency converter 16, an I.-F. amplifier 18, a second detector 20, an audio amplifier 22, and a loudspeaker 24. The foregoing stages are serially coupled to one another in the order stated, and are supplied with operating potentials by a source of positive direct voltage 26, via a line 28. In addition, an AGC potential produced by second detector 20 is supplied to R.-F. amplifier 14 and I.-F. amplifier 18 via a line 30 which is coupled to the output of detector 20 by means of a resistance-capacitance low-pass filter. This filter comprises resistors 32 and 34, connected serially between the output of second detector 20 and line 30, a capacitor 36 connected between the junction of resistors 32 and 34 and a point at ground potential, and a capacitor 38 connected between the junction of line 30 and resistor 34 and a point at ground potential.

Frequency converter 16, I.-F. amplifier 18, and audio amplifier 22 may have conventional structures, and hence are indicated in block form in the circuit diagram. Second detector 20 is also of conventional design, but is shown here in detail in order to indicate the precise manner in which the AGC voltage for R.-F. amplifier 14 and I.-F. amplifier 18 is developed. As shown in the drawing, this detector comprises a transistor 40, having emitter, collector, and base electrodes 42, 44 and 46 respectively, and which may be, for example, a p-n-p junction transistor or a surface-barrier transistor. Transistor 40 is connected in the common-emitter configuration, its emitter 42 being coupled to a point at reference potential by means of a capacitor 48 which preferably has a large value.

Transistor 40 is provided with biasing potentials by source 26. In this regard, emitter 42 is connected to source 26 via a dropping resistor 50. The base electrode 46 derives its bias from a voltage divider, comprising resistors 52 and 54 connected serially from emitter 42 to a point at ground potential. In particular, base 46 is connected to the interconnection of resistors 52 and 54 through the secondary winding 56 of an I.-F. transformer 58 which serves to couple I.-F. amplifier 18 to second detector 20. In addition, collector 44 is established at a direct potential which is more negative than that of either emitter 42 or base 46, by being connected to a point at reference potential via a load resistor 60.

The intermediate frequency circuits of base 46 and collector 44 are completed to a point at reference potential by means of I.-F. by-pass capacitors 62 and 64 respectively.

The bias voltages applied to the various electrodes of transistor 40 have values such that detector 20 produces an output voltage of positive polarity at collector 44 in response to an I.-F. signal supplied to detector 20 by amplifier 18. This positive-going output voltage, whose value is proportional to the amplitude of the signal supplied by I.-F. amplifier 18, is supplied to audio amplifier 22 via a low-pass filter comprising a resistor 66 and a capacitor 68. In addition, the output of detector 20 is supplied, via resistance-capacitance filter 66, 68, to the input terminal of resistor 32, which forms part of the AGC low-pass filter.

Turning now to R.-F. amplifier 14, the structure shown in the drawing is a preferred form of the semiconductive signal-translating system of my invention. This structure comprises a transistor 70 having emitter, collector, and base electrodes 72, 74 and 76, respectively. Transistor 70 may be a surface-barrier transistor or a junction transistor, and, in the embodiment shown, is of a type having an N-type base. Emitter electrode 72 of transistor 70 is supplied with a positive biasing potential derived from a voltage divider, comprising serially connected resistances 78 and 80, which is connected between the positive pole of source 26 and a point at reference potential. This biasing potential is applied to emitter 72 by means of a resistor 82 preferably having a small value, and a non-linear, direct-current-conductive impedance element, which in this embodiment comprises a diode 84. Resistor 82 and diode 84 are connected serially, and in the order named, between the junction of resistors 78 and 80 and emitter electrode 72, and, in accordance with a feature of my invention, diode 84 is poled in a forward-conductive sense, i.e. its anode 86 is connected to resistor 82, while its cathode 88 is connected to emitter 72.

The direct potential for base electrode 76 is controlled in accordance with the voltage present on AGC line 30, which is connected to base 76 by a resistor 90. Base electrode 76 is connected also to a point at reference potential by means of a resistor 92, resistors 90 and 92 thereby serving as the elements of a voltage divider for reducing the magnitude of the AGC potential supplied to base electrode 76 from line 30. In accordance with a further feature of my invention, base electrode 76 is coupled, in addition, to emitter 72 by means of an interconnecting capacitor 94. The A.-C. return path for emitter 72 is provided by a capacitor 104 connecting the anode 86 of diode 84 to a point at reference potential.

The output circuit of R.-F. amplifier 14, which comprises a variable inductor 96 shunted by series-connected capacitors 98 and 100 respectively, is arranged to resonate at the frequency of a signal received by antenna 10. Inductor 96 connects collector 74 to a point at reference potential, thereby serving as the D.-C. return path for that transistor element, while the interconnection 102 of capacitors 98 and 100 is connected to the input of frequency converter 16. Capacitor 98 is shown as a variable capacitor and may in practice comprise a fixed capacitor (not shown) shunted by a variable trimmer capacitor whose value is adjusted so as to provide proper tracking of the resonant frequency of this tuned circuit with that of the frequency converter 16 as the position of the tuning slug of inductor 96 is varied.

As aforementioned, the input of amplifier 14 is coupled to antenna 10 by means of impedance-transforming network 12. In the arrangement shown, this impedance-transforming network is a pi-network which includes a variable inductor 106 connected in series between antenna 10 and base electrode 76, a capacitor 108 connected between the input of antenna 10 and a point at reference potential, and a capacitor 110 connected between base electrode 76 and a point at reference potential. As aforementioned, inductor 106 is a variable inductor, and preferably capacitor 108 is a variable capacitor, so that the pi-network 12 may be tuned substantially to resonance with a desired incoming signal supplied by antenna 10 by varying the value of inductor 106, and may be adjusted, by appropriately establishing the value of capacitor 108, to track with tuned circuit 96, 98 and 100. In this regard, the tuning core of variable inductor 106 is mechanically coupled to that of variable inductor 96 and to the variable tuning element (not shown) of frequency converter 16, thereby to obtain tracked tuning of the receiver in a manner well known to those skilled in the art.

Moreover, capacitor 110 preferably has a capacitance which is substantially larger than that of capacitor 108, thereby to obtain a low impedance output from impedance transforming stage 12. Preferably, for reasons discussed hereinafter, the output impedance of network 12 is equal to or slightly lower than the minimum input impedance of R.-F. amplifier 14 between base electrode 76 and a point at reference potential.

The several reasons for the versatile gain control ability which characterizes my novel transistor amplifier 14 may be appreciated by considering its operation in response to an alternating input signal supplied to network 12 by antenna 10, which signal has a frequency within the tunable range of the receiver and is increasing in amplitude. Initially, when this input signal is of small amplitude, only a relatively small positive AGC voltage, developed by detector 20 in response thereto, is supplied to base 76 via line 30. Since emitter 72 is biased by source 26 to a substantially higher positive potential than that of this AGC voltage, a direct current component of substantial intensity flows in the emitter circuit through forward-biased diode 84. As a result, the impedances exhibited both by the base-to-emitter path of transistor 70 and by diode 84 are relatively low, and the increase over prior-art values in the input impedance of amplifier 14 (as measured between base 76 of transistor 70 and a point at reference potential), which results from the inclusion of diode 84 in the emitter circuit, is relatively small. Moreover, because capacitor 94 provides a path for alternating currents, the actual input impedance of amplifier 14 is substantially lower than is the input impedance of prior-art amplifiers, in which both capacitor 94 and diode 84 are omitted and in which emitter 72 is directly connected to its bias source.

In the preferred form of my invention, the output impedance of impedance-transforming network 12 is arranged to be substantially equal to or even slightly less than the input impedance of amplifier 14 when the amplifier is operating under the foregoing minimum-input-impedance conditions. Because of this substantial equality in the output impedance of network 12 and the input impedance of amplifier 14, there is a substantially maximum transfer of signal power from network 12 to amplifier 14, and a consequent maximum amplification of the signal power from antenna 10 to output network 96, 98, and 100 supplying converter 16.

As the input signal intercepted by antenna 10 becomes increasingly strong, a positive AGC voltage of increasingly large value is supplied by detector 20 to AGC line 30 and thence to base 76 of transistor 70. Since the biasing voltage supplied by source 26 to the anode 86 of diode 84 (which in turn supplies emitter 72 with its biasing voltage) remains relatively constant, the potential difference between base 76 and emitter 72 diminishes, as does the potential difference between anode 86 and cathode 88 of diode 84. As a result of this diminution in the base-emitter potential difference, the impedance between base 76 and emitter 72 rises, and similarly, as the result of the decrease in the potential difference across diode 84, the impedance of this diode also rises. As a result of the rise in impedance of the base-emitter path of transistor 70, augmented by the rise in impedance of diode 84, the impedance of amplifier 14 rises substantially.

This increase in input impedance, produced in response to an increase in the value of the AGC potential, is still further augmented by virtue of the fact that the input impedance-reducing effect exerted by capacitor 94 becomes weaker as the impedance of diode 84 becomes larger. Hence the total change in the input impedance of amplifier 14, produced in response to a given change in AGC potential, is substantially larger than the change produced in response to the same change in AGC potential, in prior-art amplifiers of the aforedescribed type in which capacitor 94 and diode 84 are omitted.

By reason of these increases in the input impedance of amplifier 14, a substantial mismatch is created between it and network 12. This mismatch reduces the amount of power transferred between antenna 10 and the input of amplifier 14, and hence reduces the amount of power supplied to output load 96, 98, 100. It is a feature of the invention that this change in transferred power per unit change in AGC voltage is substantially greater than in the aforementioned prior-art arrangements because of the lower initial value of the input impedance of this amplifier and because of the larger increases in this input impedance per unit change in the AGC voltage.

While I do not wish to be bound by the specific details of any theory, the following theoretical considerations are set forth in order that the invention and its modes of application may be more fully understood. In this regard, it is known that a maximum transfer of power, from a generator of alternating voltage having a given series output impedance to a load connected thereacross, occurs when the impedance of the load is equal to the complex conjugate of the generator impedance.

Moreover it is known that increases in the magnitude of the load impedance above the magnitude of the generator impedance tend to reduce the amount of power transferred by the generator to the load. Importantly, it can be shown that the amount by which the power supplied to the load changes, in response to a change in load impedance, is inversely dependent upon the value of the load impedance and is directly dependent upon the percentage of change in the load impedance.

In the present case, the generator impedance is the output impedance of network 12 and the load impedance is the input impedance of amplifier 14. As aforementioned, the minimum value of this input impedance is lower than the input impedance of prior-art transistor amplifiers of comparable construction. Hence, in the present case, a given change in input power, and therefore in output power, may be produced by effecting a smaller percentage change in the input impedance of my amplifier than is required in prior-art amplifiers. Since this percentage change in input impedance is substantially proportional to the ratio of the absolute change in input impedance to the initial value of the input impedance, the value of the absolute change in my arrangement may be considerably smaller, per unit change of AGC potential, than that required in the prior-art arrangement. However, the absolute change in input impedance, per unit change in AGC potential, is in fact substantially larger in my arrangement than that achieved in prior-art arrangements, and hence the percentage change in input impedance is considerably larger. As a result, the change in power amplification of my system, produced in response to a given change in AGC potential, is considerably greater than the change achievable by prior-art arrangements.

Accordingly, to achieve a given range of power gain in my arrangement, a smaller range of AGC potential suffices. Alternatively, where wider ranges of AGC potential are to be used, ranges of variation in power gain are obtained which are wider than were obtainable in prior-art circuits. Moreover, because my system is more sensitive to the AGC control potential, it is feasible to operate transistor 70 thereof under bias conditions which provide for substantially more intense emitter-base and collector-base static direct currents. These operating conditions produce more linear amplification than the prior-art could achieve for a comparable AGC range.

It has been found that the maximum reduction in the input impedance of R.-F. amplifier 14, and the greatest percentage change in this input impedance for a given change in the AGC voltage, are obtained when capacitor 94 has a relatively low reactance at the frequency of the signal supplied by antenna 10. However, in the embodiment shown in the drawing, this particular consideration must be balanced against the varying detuning effect upon impedance network 12, produced by capacitor 94, by reason of the variations of the resistance of diode 84. It has been found in practice that satisfactory results are obtained when capacitor 94 has a value which is approximately equal to that of capacitor 110.

In a typical case, for a superheterodyne receiver adapted to receive signals having frequencies within the conventional broadcast band, i.e. in the range of 540 kc./s. to 1600 kc./s., and in which source 26 is arranged to supply 13.8 volts D.-C., the component parts of impedance network 12, R.-F. amplifier 14, second detector 20, and the AGC filter may have the following values:

*Impedance network 12*

| | |
|---|---|
| Variable inductor **106** | 65 to 600 microhenries. |
| Variable capacitor **108** | 100 to 150 micromicrofarads. |
| Capacitor **110** | 1200 micromicrofarads. |

*R–F amplifier 14*

| | |
|---|---|
| Transistor **70** | Surface-barrier transistor 2N128. |
| Resistor **78** | 1800 ohms. |
| Resistor **80** | 2200 ohms. |
| Resistor **82** | 22 ohms. |
| Diode **84** | Type 1N107 semiconductive diode. |
| Resistor **90** | 10,000 ohms. |
| Resistor **92** | 120,000 ohms. |
| Capacitor **94** | 1000 micromicrofarads. |
| Variable inductor **96** | 14 to 140 microhenries. |
| Capacitor **98** | A fixed capacitor of 944 micromicrofarads shunted by a variable trimmer capacitor having a range of 150 to 250 micromicrofarads. |
| Capacitor **100** | 2200 micromicrofarads. |
| Capacitor **104** | 0.015 microfarad. |

*Second detector 20*

| | |
|---|---|
| Transistor **40** | Surface-barrier transistor 2N128. |
| Capacitor **48** | 50 microfarads. |
| Resistor **50** | 680 ohms. |
| Resistor **52** | 27 ohms. |
| Resistor **54** | 1800 ohms. |
| Resistor **60** | 2700 ohms. |
| Capacitor **62** | 0.1 microfarad. |
| Capacitor **64** | 0.05 microfarad. |
| Resistor **66** | 100 ohms. |
| Capacitor **68** | 0.003 microfarad. |

*AGC filter*

| | |
|---|---|
| Resistor **32** | 22,000 ohms. |
| Resistor **34** | 12,000 ohms. |
| Capacitor **36** | 0.5 microfarad. |
| Capacitor **38** | 2 microfarads. |

It is to be understood that these values are exemplary only and that I do not intend that the scope of my invention shall be limited thereto.

It will be apparent to those skilled in the art that impedance network 12 need not have the form of a pi-network, such as is indicated in the drawing, but may have one of many forms, for example, the form of a T-network, or of a step-down transformer. In the latter case, one terminal of the output winding of the step-down transformer would be connected to base electrode 76, while the other terminal thereof would be connected to the junction of resistors 90 and 92. The direct connection, shown in the drawing, between this junction and base 76 should, of course, then be broken. In addition, resistor 92 should then be shunted by a by-pass capacitor having a value such that its reactance is negligibly small at frequencies within the radio-frequency range tuned by the receiver, but high, compared to the resistance of resistor 92, at the frequencies at which the AGC voltage on line 30 varies.

Moreover, the load circuit of R.-F. amplifier 14 need not necessarily have the form shown therein, of an inductor 96 shunted by two capacitors 98 and 100. Many other types of loads, including a resistive load for example, may be used, as will be apparent to those skilled in the art. Furthermore, the non-linear, direct-current-conductive impedance, shown as diode 84 in the drawing, need not be a rectifying element but may take alternative forms. For example, this element may comprise a thermistor having a resistance which decreases in response to an increasingly large voltage applied thereacross.

It will be understood that my amplifier has numerous applications other than that of R.-F. amplifier in a superheterodyne receiver. It may, for example, be used as an I.-F. amplifier of such a receiver, or as an amplifier of a tuned-radio-frequency, regenerative or superregenerative receiver. As a further example, amplifier 14 may be used as the gain controllable stage of a public address system whose output level is automatically increased in response to an increase in the ambient noise level of the locality toward which the loudspeaker is directed, or alternatively as that stage of an audio amplifier whose gain is manually controllable. In view of the foregoing discussion, numerous additional uses will doubtless suggest themselves to those skilled in the art.

While I have described my invention by means of specific examples and in a specific embodiment, I do not wish to be limited thereto, for obvious modifications will occur to those skilled in the art without departing from the scope of my invention.

What I claim is:

1. A signal-translating system comprising a circuit arrangement including a transistor having emitter, collector and base electrodes, a non-linear element responsive to an increase in a voltage applied thereacross to decrease its resistance, means connecting one terminal of said non-linear element to said emitter electrode, a capacitor connected between said emitter and base electrodes, and means coupled to said collector electrode for deriving an output signal therefrom, said arrangement being characterized by an input impedance, between said base electrode and the other terminal of said non-linear element, whose resistive portion is positive and increases in response to an increase in said resistance of said non-linear element, and which has a minimum value dependent upon the minimum value of said resistance of said non-linear element; a source of alternating voltage connected between said base electrode and said other terminal of said non-linear element, said voltage source having a series output impedance whose magnitude is less than said minimum resistive portion of said input impedance, and means responsive to the amplitude of said alternating voltage for supplying a control voltage to said base electrode.

2. A signal-translating system according to claim 1, wherein said voltage source comprises an antenna and an impedance-transforming network having an input terminal connected to said antenna and an output terminal connected to said base electrode of said transistor.

3. A radio signal receiver comprising: an antenna for intercepting said radio signal; impedance-transforming means having an input terminal coupled to said antenna; a semiconductive signal-translating device, said device comprising a transistor having emitter, collector and base electrodes, a non-linear resistance element responsive to an increase in a voltage applied thereacross to decrease its resistance, means connecting said non-linear element in series between said emitter electrode and a point at reference potential, a capacitor connected between said base and emitter electrodes, means connecting said base electrode to an output terminal of said impedance-transforming means, and means for deriving an output signal from said collector electrode; and a detector circuit having an input terminal coupled to said output signal-deriving means and arranged to develop a control potential whose value is directly dependent upon the amplitude of said radio signal, and means supplying said control potential to said base electrode of said transistor to control the gain of said receiver.

4. A radio receiver according to claim 3, wherein said non-linear resistance element of said signal-translating device comprises a diode poled in the forward-conductive sense.

5. A radio receiver according to claim 3, wherein said impedance-transforming means comprises a network having an input terminal, an output terminal, and a common terminal, a first capacitor interconnecting said input terminal and said common terminal, a second capacitor interconnecting said output terminal and said common terminal and an inductor interconnecting said input and output terminals, said input terminal being connected to said antenna, said output terminal being connected to said base electrode, and said first capacitor having a capacitance value smaller than that of said second capacitor.

6. A radio receiver according to claim 5, wherein said signal-translating device is characterized by a minimum input impedance whose value is dependent upon the minimum value of said non-linear resistance element, and wherein said network is constituted so that the impedance between said output and common terminals thereof has a value less than said minimum value.

7. A signal-translating system comprising a circuit arrangement including a transistor having emitter, collector and base electrodes, a non-linear element responsive to an increase in a voltage applied thereacross to decrease its resistance, means connecting one terminal of said non-linear element to said emitter element, means for maintaining an operating voltage between the other terminal of said non-linear element and said base electrode concurrently with the application of an input signal between said other terminal and base electrode, said operating voltage being poled so as to produce minority-carrier injection by said emitter electrode and said non-linear element being responsive to a decrease in the intensity of the unidirectional component of the emitter current to increase its resistance, a capacitor connected between said emitter and base electrodes, and means coupled to said collector electrode for deriving an output signal therefrom, said arrangement being characterized by an input impedance, between said base electrode and said other terminal of said non-linear element, whose resistive portion is positive and increases in response to an increase in said resistance of said non-linear element and which has a minimum value dependent upon the minimum value of said resistance of said non-linear element; a source of alternating voltage connected between said base electrode and said other terminal of said non-linear element, said voltage source having a series output impedance whose magnitude is less than said minimum resistive portion of said input impedance, and means responsive to the amplitude of said alternating voltage for supplying a control voltage to said base electrode.

8. A signal-translating system comprising a transistor having emitter, base and collector electrodes; a non-linear direct-current-conductive impedance element having one terminal connected to said emitter electrode of said transistor; means for applying an input signal between said base electrode of said transistor and the other terminal of said non-linear element; means responsive to said input signal for supplying to said base electrode a control voltage the magnitude of which is directly dependent on the amplitude of said input signal; and means for deriving from said collector electrode an output signal produced in response to said input signal.

9. A signal-translating system according to claim 8, said system additionally including a capacitor connected between said emitter and base electrodes.

10. A signal-translating system comprising a transistor having emitter, base and collector electrodes; a non-linear, direct-current-conductive impedance element; means connecting one terminal of said non-linear element to said emitter electrode of said transistor in a manner such that a decrease in the intensity of the unidirectional component of the emitter current flowing through said non-linear element produces an increase in the input impedance thereof; means for applying an input signal between said base electrode of said transistor and the other terminal of said non-linear element; means responsive to said input signal for supplying to said base electrode a unidirectional control voltage the magnitude of which is directly dependent on the amplitude of said input signal; and means for deriving from said collector electrode an output signal produced in response to said input signal.

11. A signal-translating system according to claim 10, said system additionally including a capacitor connected between said emitter and base electrodes.

12. A signal-translating system comprising a transistor having emitter, collector and base electrodes; a non-linear element responsive to an increase in voltage thereacross to decrease its resistance; means connecting one terminal of said non-linear element to said emitter electrode; a source of alternating voltage connected between said base electrode and the other terminal of said non-linear element; means responsive to the amplitude of said alternating voltage for supplying to said base electrode a unidirectional control voltage the magnitude of which is directly dependent on the amplitude of said alternating voltage; and means for deriving an output signal from said collector electrode.

13. A signal-translating system according to claim 12, said system additionally including a capacitor connected between said emitter and base electrodes.

References Cited in the file of this patent

UNITED STATES PATENTS

| | | |
|---|---|---|
| 2,182,329 | Wheeler | Dec. 5, 1939 |
| 2,622,212 | Anderson et al. | Dec. 16, 1952 |
| 2,644,895 | Lo | July 7, 1953 |

OTHER REFERENCES

"Electrical Engineering," December 1954, pp. 1107–1112, Stern-Raper "Transistor Broadcast Receivers," Fig. 6, p. 1110.

Terman: "Radio Engineering Handbook," third ed., 1943, McGraw-Hill publication, pp. 210–214.